United States Patent
Iwase et al.

(10) Patent No.: US 7,443,077 B2
(45) Date of Patent: Oct. 28, 2008

(54) STACKED-TYPE PIEZOELECTRIC DEVICE AND PRODUCTION METHOD

(75) Inventors: Akio Iwase, Nishio (JP); Shige Kadotani, Chita-gun (JP); Kenji Suzuki, Nishio (JP)

(73) Assignee: Denso Corporation (JP)

( * ) Notice: Subject to any disclaimer, the term of this patent is extended or adjusted under 35 U.S.C. 154(b) by 396 days.

(21) Appl. No.: 11/101,458

(22) Filed: Apr. 8, 2005

(65) Prior Publication Data

US 2005/0231074 A1    Oct. 20, 2005

(30) Foreign Application Priority Data

Apr. 14, 2004    (JP)    ............................ 2004-119418

(51) Int. Cl.
*H01L 41/08*    (2006.01)
(52) U.S. Cl. ..................................... 310/328
(58) Field of Classification Search ............... 310/328, 310/364–366; *H01L 41/08*
See application file for complete search history.

(56) References Cited

U.S. PATENT DOCUMENTS

| 4,885,948 | A | * | 12/1989 | Thrasher et al. | ............... 310/83 |
| 5,089,739 | A | * | 2/1992 | Takahashi et al. | ........... 310/328 |
| 5,126,678 | A | * | 6/1992 | Williams | ..................... 324/545 |
| 7,271,524 | B2 | * | 9/2007 | Sugg | ......................... 310/328 |

FOREIGN PATENT DOCUMENTS

| JP | 6-252469 | | 9/1994 |
| JP | 2003-197998 | | 7/2003 |
| JP | 2003243738 | * | 8/2003 |

* cited by examiner

*Primary Examiner*—Darren Schuberg
*Assistant Examiner*—Karen Addison
(74) *Attorney, Agent, or Firm*—Nixon & Vanderhye PC

(57) ABSTRACT

A stacked-type piezoelectric device comprising a ceramic stacked body constituted by alternately stacking ceramic layers and internal electrode layers one upon another, and a pair of external electrodes bonded respectively to a pair of bond surfaces formed on an outer peripheral surface of the ceramic stacked body, in which the ceramic stacked body has, at least partially in a peripheral direction, a groove portion recessed in a groove shape from its outer peripheral surface in such a fashion as to be adjacent to a stacking surface of each internal electrode layer, and a production method thereof.

5 Claims, 13 Drawing Sheets

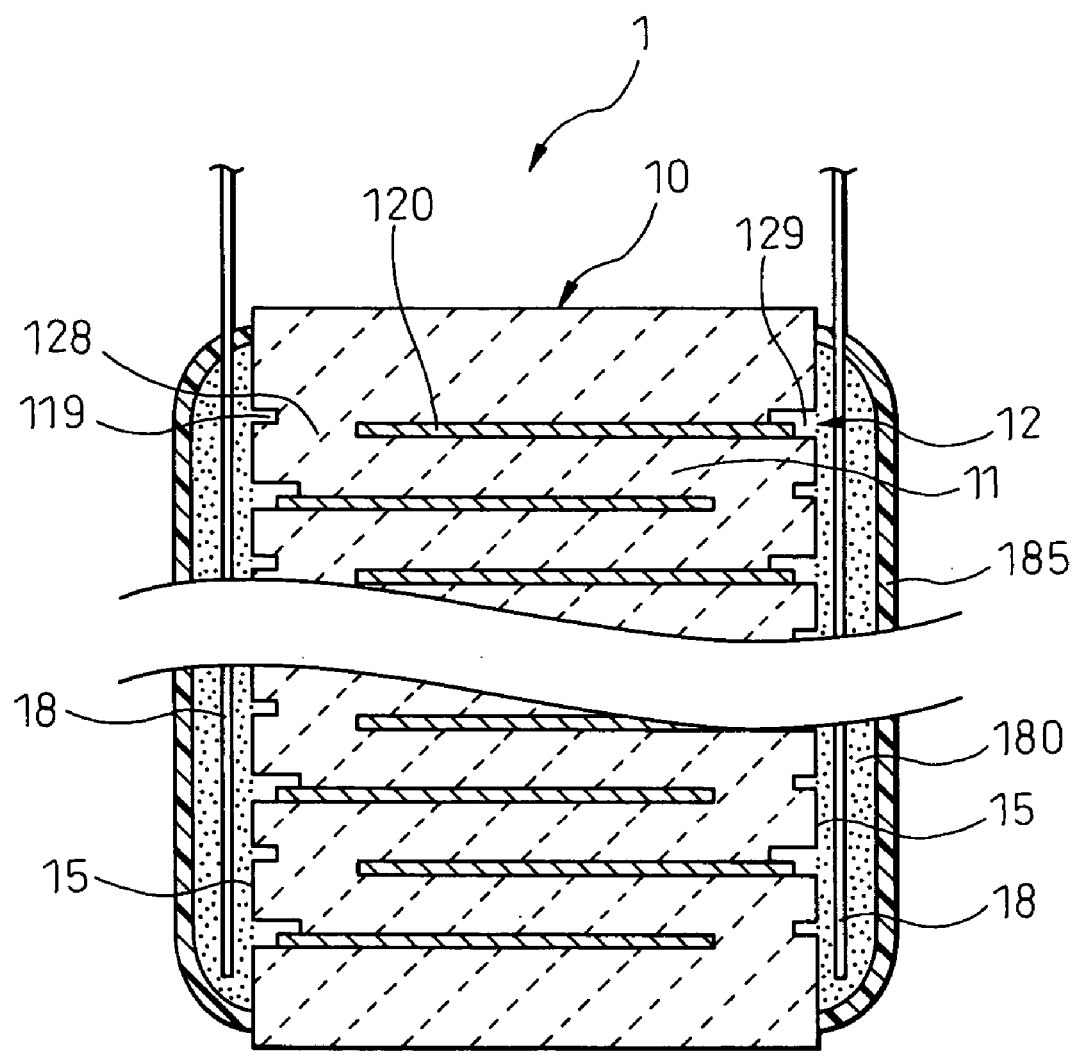

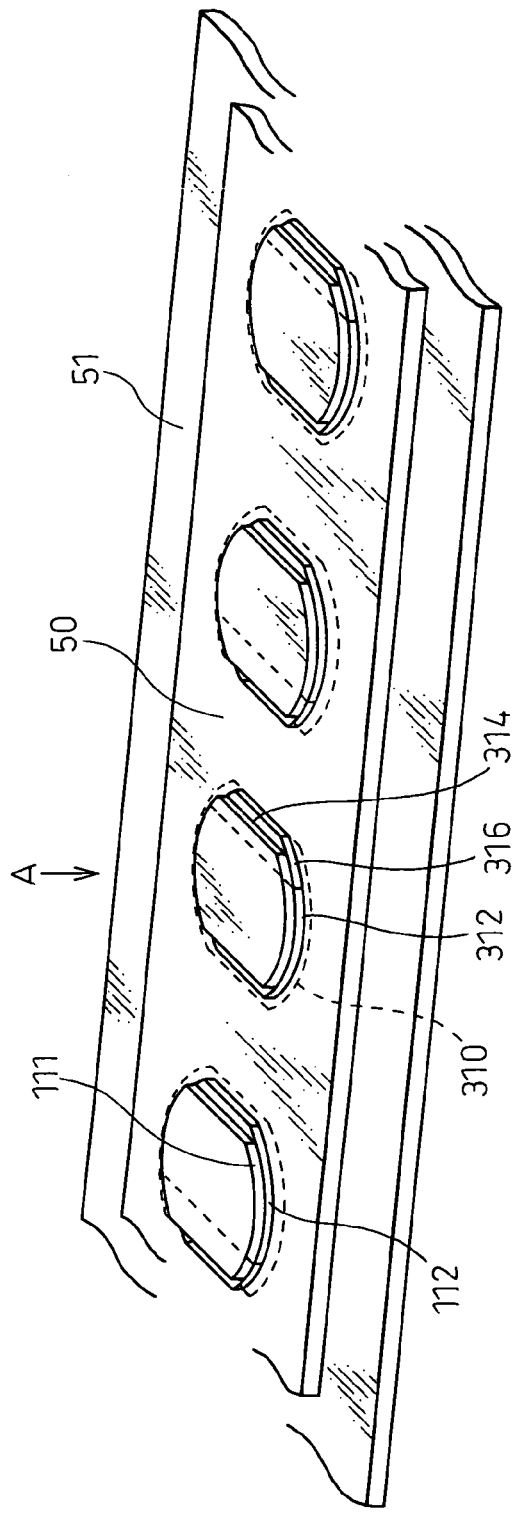
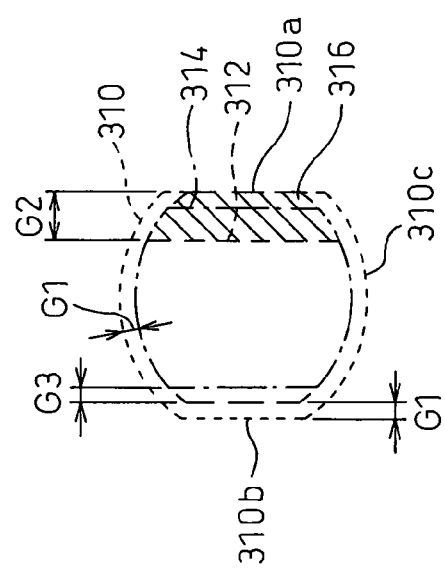
Fig.3A
Fig.3B

STACKED-TYPE PIEZOELECTRIC DEVICE AND PRODUCTION METHOD

BACKGROUND OF THE INVENTION

1. Field of the Invention

This invention relates to a stacked-type piezoelectric device, that has high quality and can be efficiently produced, and to a production method.

2. Description of Related Art

To produce a stacked-type piezoelectric device, a conventional method includes the production of an intermediate stacked body by alternately stacking ceramic raw material layers and electrode material layers and firing the intermediate stacked body, for example. Thereafter, to complete the stacked-type piezoelectric device by bonding a pair of external electrodes to outer surface of this ceramic stacked body, it has been necessary to polish the outer peripheral surface of the ceramic stacked body (see, Japanese Unexamined Patent Publication (Kokai) No. 2003-197998, for example). One of the objects of polishing the outer peripheral surface of the fired ceramic stacked body is to remove fired residues of the electrode raw material adhering to the outer peripheral surface of the ceramic layer and fired residues of the ceramic raw material adhering to the outer peripheral surface of the internal electrode layer, because electrode material and other materials adhering to the outer peripheral surface of the ceramic layer can cause an electrical inner leak of the stacked piezoelectric device and the ceramic material adhering to the outer peripheral surface of the internal electrode layer can cause an electrical connection defect between the external electrode and the internal electrode layer.

However, the prior art stacked-type piezoelectric device and the production method described above involve the following problems. For example, when the outer peripheral surface of the ceramic stacked body is mechanically polished after firing, micro-cracks and other defects can occur on the outer peripheral surface of the ceramic stacked body to lower quality of the ceramic stacked body, so that performance, durability and other properties of the stacked-type piezoelectric device produced by using this ceramic stacked body are likely to remarkably drop. On the other hand, when the machining speed is set to a sufficiently low rate, the occurrence of the micro-cracks can be suppressed but in this case, it is difficult to improve production efficiency.

SUMMARY OF THE INVENTION

In view of the problems described above, this invention aims at providing a stacked-type piezoelectric device constituted from a ceramic stacked body having high reliability and excellent quality, and a production method.

According to the first invention, there is provided a stacked-type piezoelectric device comprising a ceramic stacked body formed by alternately stacking ceramic layers and internal electrode layers, and a pair of external electrodes respectively connected to a pair of bond surfaces formed on an outer peripheral surface of the ceramic stacked body, wherein the ceramic stacked body has a groove portion recessed, in a groove shape, in an outer peripheral surface of the ceramic stacked body, the groove pattern being formed at least partially in a peripheral direction in the outer peripheral surface and being adjacent to a stacking surface of each of the internal electrode layers.

In the ceramic stacked body in the stacked-type piezoelectric device according to the first invention, the groove portion recessed into the outer peripheral surface of the ceramic stacked body into the groove shape is formed at least partially in the peripheral direction in such a fashion as to be adjacent to the stacking surface of each internal electrode.

Accordingly, in the stacked-type piezoelectric device described above, when the outer peripheral surface of the ceramic stacked body is covered with an insulating mold resin, for example, the insulating mold resin is allowed into the groove portion. Therefore, the insulating mold resin can be firmly held and the possibility of the reduction of the electrical insulating property due to its peeling or separation can be suppressed. Further, when an electric connection between the internal electrode layer and the external electrode is secured through the electrical conductive material having conductivity described above, as bonding is done in such a fashion that the conductive material can move into the groove portion, the conductive material can be firmly held against the internal electrode layer and thus its electric connection reliability can be improved.

As described above, because the ceramic stacked body can firmly hold the conductive material and the insulating material at the groove portion on its outer peripheral surface, electric reliability can be secured more easily than the ceramic stacked bodies not having the groove portion.

As can be appreciated from the above facts, the stacked-type piezoelectric device according to the first invention has excellent quality having high electrical reliability because it is constituted by using the ceramic stacked body having the groove portion formed on the outer peripheral surface thereof.

According to the second invention, there is provided a method for producing a stacked-type piezoelectric device comprising a ceramic stacked body produced by alternately stacking ceramic layers and internal electrode layers one upon another and a pair of external electrodes respectively connected to a pair of bond surfaces formed on an outer peripheral surface of the ceramic stacked body, wherein the ceramic stacked body has a groove portion recessed into a groove shape in an outer peripheral surface of the ceramic stacked body, the groove portion being formed at least partially in a peripheral direction of the outer peripheral surface and being adjacent to a stacking surface of each of the internal electrode layers, in which the method comprises forming a green sheet having a punch-out area for obtaining sheet pieces consisting of a ceramic raw material; printing an electrode material for forming the internal electrode portions in an electrode material arrangement area constituting at least a part of the punch-out area; printing an adhesive material for bonding the sheet pieces to one another in an adhesive material arrangement area recessed inward from an outer edge of an edge portion of the punch-out area for forming the groove portion, after printing of the electrode material; punching out the punch-out area from the green sheet to obtain the sheet pieces; stacking the sheet pieces to form an intermediate stacked body; and firing the intermediate stacked body to obtain the ceramic stacked body.

In the adhesive material printing step in the production method of the stacked-type piezoelectric device according to the second invention, an adhesive material is printed to the adhesive material arrangement area that is recessed inward from the outer edge of the edge portion of the punch-out area for forming the groove portion. Thereafter, the stacking step and the baking step are carried out to obtain the stacked-type piezoelectric device.

As described above, according to the production method of the stacked-type piezoelectric device according to the second invention, the stacked-type piezoelectric device using the ceramic stacked body having the groove portion recessed into the groove shape, that is formed at least partially in the peripheral direction along the stacking layer of the internal electrode layer, can be efficiently produced.

BRIEF DESCRIPTION OF THE DRAWINGS

FIG. 2 is a sectional view showing a construction of a stacked-type piezoelectric device according to Example 1;

FIG. 3A is a perspective view showing a punch-out area of a green sheet according to Example 1 and illustrates a green sheet surface;

FIG. 3B is an explanatory view showing a punch-out area of a green sheet according to Example 1, taken in the direction of arrow "A";

DESCRIPTION OF THE PREFERRED EMBODIMENTS

Figure 1:
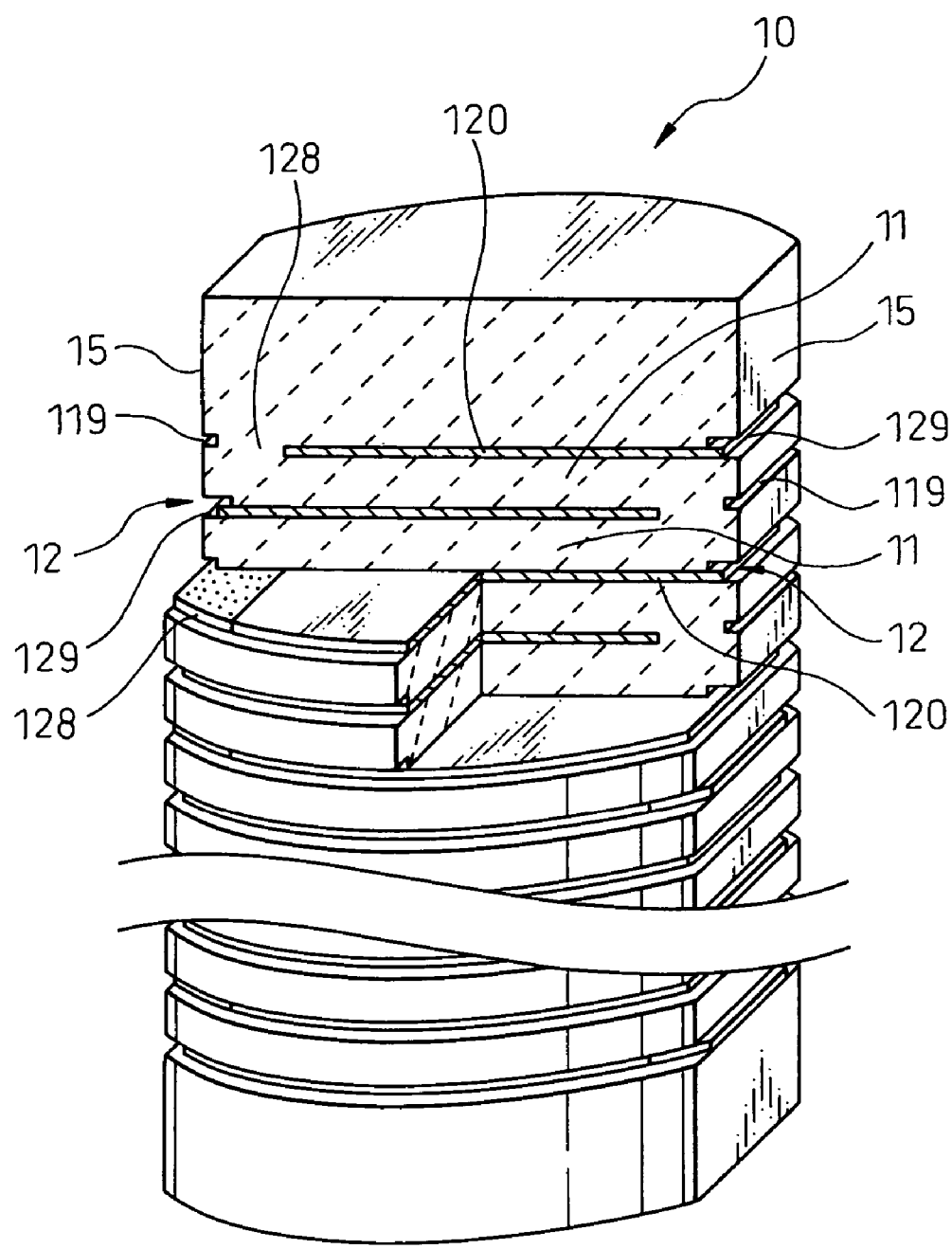
FIG. 1 is a partial sectional view showing a ceramic stacked body according to Example 1.

In the first invention described above, the internal electrode layer preferably comprises an internal electrode portion having electric conductivity and a recess portion formed by recessing inward an outer peripheral edge portion of the internal electrode portion from the outer peripheral surface of the ceramic stacked body and adjacent to the groove portion in the stacking direction.

In this embodiment, the recess portion is exposed to the outer peripheral surface of the ceramic stacked body and the outer peripheral edge portion of the internal electrode portion can be so arranged as to be recessed inward from the outer peripheral surface of the ceramic stacked body. In the ceramic stacked body described above, the recess portion is formed in such a fashion as to provide a profile of the integral groove shape adjacent to the groove portion in the stacking direction.

Therefore, in the stacked-type piezoelectric device, when an insulating mold film, for example, covers the outer peripheral surface of the ceramic stacked body, the material of the insulating mold film can be integrally filled into the recess portion and the groove portion to reliably ensure the electric insulating property. Furthermore, the possibility of peeling and other risks can be suppressed as the insulating mold film is allowed to integrally cut into the recess portion and the groove portion. As the ceramic stacked body has the recess portion integrally formed with the groove portion on its outer peripheral surface, the electric insulating property on the outer peripheral surface of the ceramic stacked body can be secured more easily than in ceramic stacked bodies having no integrally formed recess and groove portions.

Further, in the ceramic stacked body having the recess portion and the groove portion, a part of the conductive material for electrically connecting the external electrode to the internal electrode portion can be integrally filled into the recess portion and the groove portion. When a part of the conductive material is allowed to integrally cut into the recess portion and the groove portion, the conductive material can be firmly held on the outer peripheral surface of the ceramic stacked body and electrical connection reliability between the external electrode and the internal electrode portion through the conductive material can be improved.

In the above-described ceramic stacked body having the recessed portion and the groove portion formed integrally, the insulating property and the electric connection can be easily ensured, and the stacked-type piezoelectric device constituted by using the ceramic stacked body can exhibit high electrical reliability.

Furthermore, the depth of the recess portion from the outer peripheral surface of the ceramic stacked body is preferably 10 to 180 μm.

In this embodiment, the possibility of the reduction in the stacking strength and stacking accuracy of the ceramic stacked body is small and thus the recess portion can be formed on the outer peripheral surface of the ceramic stacked body without suffering from such a possibility.

Moreover, the groove portion and the recess portion are preferably arranged and extended throughout the entire outer periphery of the internal electrode layer.

In this embodiment, the ceramic stacked body can easily ensure the electric insulating property throughout its entire outer peripheral surface. The stacked-type piezoelectric device constituted by using this ceramic stacked body can exhibit high electrical reliability and excellent quality.

In addition, it is preferred that the internal electrode layer described above has a stay portion consisting of a ceramic material having substantially the same composition as that of the ceramic layer, the stay portion being formed in such a fashion that an outer peripheral edge thereof is recessed from an outer peripheral surface of the ceramic stacked body on either one of the pair of bond surfaces, and the internal electrode layers of every other layers have the recess portion exposed on one bond surface of the pair of bond surfaces and have the stay portion on another bond surface, and the internal electrode layers of every other layers have the recess portion exposed on another bond surface of the pair of the bond surfaces and have the stay portion on the one bond surface.

In this embodiment, as the outer peripheral edge portion of the internal electrode layer portion of each of every other layer is covered with the stay portion on the pair of bond surfaces, the external electrode can be bonded to each bond surface in such a fashion that only the internal electrode layers of every other layers can be electrically connected. Thus, in the stacked-type piezoelectric device, electrical reliability can be further improved.

It is preferred that the recess portion of each of the internal electrode layers is so formed as to extend throughout the entire outer peripheral surface of the ceramic stacked body other than the bond surface on which the stay portion is formed.

In this embodiment, because the stay portion reliably covers the internal electrode portion on one of the bond surfaces, the electric insulation property between the internal electrode portion and one of the external electrodes can be reliably secured, and on the outer peripheral surface of the ceramic stacked body with the exception of this one bond surface, electrical reliability can be easily secured by utilizing the recess portion and the groove portion.

Further, the depth of the groove portion is preferably greater than the depth of the recess portion on at least the bond surface of the outer peripheral surface of the ceramic stacked body.

In this embodiment, the outer peripheral edge portion of the internal electrode portion can be allowed to reliably protrude within the recess portion on the bond surface. Therefore, polishing or others are not required for exposing the internal electrode portion in the recess portion.

In the second invention, it is preferred that the internal electrode layer in the ceramic stacked body comprises an internal electrode portion having electric conductivity, and a recess portion formed by recessing inward an outer peripheral edge portion of the internal electrode portion from the outer peripheral surface of the ceramic stacked body and adjacent to the groove portion in the stacking direction, and an electrode material for forming the internal electrode portion is printed to an electrode material arrangement area recessed inward from an outer edge of an edge portion for forming the recess portion in the punch-out area in the electrode material printing, i.e., electrode arrangement step.

In this embodiment, in the electrode arrangement area described above, the electrode material is printed onto the electrode material arrangement area recessed inward from the outer edge of the edge portion for forming the recess portion in the punch-out area. When the intermediate stacked body is fired in the subsequent firing step, the stacked-type piezoelectric device having the internal electrode portion and the internal electrode layer having the recess portion can be efficiently produced.

Further, it is preferred in the electrode arrangement step described above that the clearance between an outer edge of the punch-out area and an outer edge of the electrode material arrangement area is set to 12 to 100 µm at a portion that constitutes the recess portion, in the electrode arrangement step.

In this embodiment, the recess portion having a suitable depth can be formed in the ceramic stacked body after firing. When the clearance between the outer edge of the punch-out area and the outer edge of the electrode material arrangement area is set within the range described above, the recess portion having a depth of about 10 to about 80 µm can be formed based on shrinkage of the ceramic stacked body during firing.

Furthermore, it is preferred in the adhesive material printing and arrangement step that the depth of the recess portion facing the bond surface is smaller than the depth of the groove portion adjacent to the recess portion, and the stay distance from an outer edge of the electrode material arrangement area to an outer edge of the adhesive material arrangement area recessed inward from the outer edge of the electrode material arrangement area is set to 12 to 120 µm at least in the edge portion serving as the bond surface for forming the recess portion.

In this embodiment, even when a load in the stacking direction is allowed to act on the intermediate stacked body in the stacking step described above, the possibility of fluidization of the adhesive material beyond the outer edge of the electrode material arrangement area at the portion to serve as the recess portion exposed to the bond surface can be suppressed. Therefore, the outer peripheral edge portion of the internal electrode portion can be exposed very reliably to the bottom of the recess portion exposed to the bond surface, and polishing for exposing the outer peripheral edge portion of the internal electrode portion is not necessary in this ceramic stacked body.

Moreover, it is preferred that the internal electrode layer has a stay portion formed by recessing the outer peripheral edge portion of the internal electrode portion from the outer peripheral surface of the ceramic stacked body in either one of the pair of bond surfaces and made of a ceramic material having substantially the same composition as that of the ceramic layer, the internal electrode layers of every other layers having the recess portion exposed on one bond surface of the pair of bond surfaces have the stay portion on another bond surface, the internal electrode layers of every other layers having the recess portion exposed on another bond surface of the pair of bond surfaces have the stay portion on the one bond surface, and in the electrode arrangement step, the electrode material is applied in the electrode material arrangement area recessed inward from the outer edge of the edge portion for forming the stay portion in the punch-out area.

In this embodiment, the ceramic stacked body having each bond surface to which the internal electrode portion is exposed in every other layer can be obtained by disposing the stay portion in each bond surface. According to such a ceramic stacked body, the external electrode that is electrically connected to the internal electrode portion of the internal electrode layer of every other layer can be bonded extremely efficiently to each bond surface. Thus, the stacked-type piezoelectric device is excellent in electrical reliability, and has excellent quality and high durability.

The stacked-type piezoelectric device having excellent quality which is constituted by utilizing the ceramic stacked body described above and in which the pair of external electrodes and the internal electrode layers of every other layer are electrically connected to one another with high reliability, and the electric insulation property between the internal electrode layer of every other layer and the internal electrode layer of every other layer and the electric insulation property of the outer peripheral surface of the ceramic stacked body are kept at a high level, can be produced efficiently.

Further it is contemplated that the ceramic raw material is arranged to a height substantially equal to the arrangement height of the electrode material in the area sandwiched by the outer edge of the portion for forming the stay portion in the punch-out area and the outer edge of the electrode material arrangement area. In this embodiment, the sheet pieces punched out have a substantially uniform stacking surface and can be stacked accurately.

Moreover, it is preferred in the electrode arrangement step described above that the clearance between the outer edge of the punch-out area and the outer edge of the electrode material arrangement area at the edge of for forming the stay portion is 12 to 100 µm.

In this embodiment, the stay portion can reliably cover the outer peripheral edge portion of the internal electrode portion and electric connection between each external electrode bonded to each bond surface and the internal electrode layer of every other layer can be reliably made and electric connection between the other internal electrode layer of every other layer and the internal electrode layer can be reliably made.

EXAMPLES

This invention will be further described with reference to its examples. Note, however, that this invention should not be restricted to these examples.

Example 1

This example is intended to explain a stacked-type piezoelectric device and its production method, and will be explained with reference to FIGS. 1 to 11.

The stacked-type piezoelectric device 1 of this example comprises a ceramic stacked body 10 formed by alternately stacking ceramic layers 11 and internal electrode layers 12, and a pair of external electrodes 18 bonded respectively to a pair of bond surfaces 15 formed on an outer peripheral surface of the ceramic stacked body 10, as shown in FIGS. 1 and 2.

The ceramic stacked body 10 has a groove portion 119 recessed in a groove form from its outer peripheral surface adjacent to a stacking surface of each internal electrode layer 12 at least partially in a circumferential direction of the outer peripheral surface.

Hereinafter, the above constitution will be explained in detail.

As shown in FIGS. 1 and 2, in the ceramic stacked body 10 of the stacked-type piezoelectric device 1 according to this example, each internal electrode layer 12 has an internal electrode portion 120 having electric conductivity and a recess portion 129 formed by recessing inward an outer peripheral edge portion of the internal electrode portion 120 from the outer peripheral surface of the ceramic stacked body 10 and adjacent to the groove portion 119 in the stacking direction.

The ceramic stacked body 10 has a diameter of 8.5 mm and is formed by alternately stacking totally 300 layers of ceramic layers 10 consisting of a ceramic material and having a thickness of 80 μm and internal electrode layer 12 having a thickness of 4 μm.

The ceramic stacked body 10 has a barrel shape in section in and a pair of bond surfaces 15, facing each other, is formed on the outer peripheral surface of the ceramic stacked body 10 having substantially a cylindrical shape, as shown in FIG. 1. Note that the sectional shape of the ceramic stacked body 10 is not limited to the barrel shape of this example but can be changed to a polygon such as a square depending on the application, use conditions and others.

As shown in FIG. 1, each internal electrode layer 12 comprises an internal electrode portion 120 recessed inward from the outer peripheral surface of the ceramic stacked body 10, a stay portion 128 so formed as to face one of the bond surfaces 15 and a recess portion 129 formed on the entire outer peripheral surface with the exception of one of the bond surfaces 15. Further, the recess portion 129 in this example has a groove shape having a depth of 180 μm and extending inward from the outer peripheral surface of the ceramic stacked body 10.

As shown in FIG. 1, the stay portion 128 is the portion at which the outer peripheral edge of the internal electrode portion 120 is covered with the material having substantially the same composition as the ceramic material forming the ceramic layer 11. Further, the recess portion 129 is the gap formed between the adjacent ceramic layers 11.

In the ceramic stacked body 10, the internal electrode portion 120 exhibits a partial electrode structure exposed through the recess portion 120 with the exception of one of the bond surfaces 15 forming the stay portion 128 in the outer peripheral surface of the ceramic stacked body 10.

As shown in FIG. 2, in the stacked-type piezoelectric device 1, the external electrodes 18 are bonded to the bond surfaces 15 by using the conductive resin material 180 having bondability and the entire outer peripheral surface is insulated and covered with a molding resin 185. Therefore, the molding resin 185 entering the recess portion 129 and the groove portion 119 electrically insulates, in a reliable way, the internal electrode portion 120 of each internal electrode layer 12 on the outer peripheral surface of the ceramic stacked body 10 other than the bond surfaces 15. Peeling, and other defects, do not result because the molding resin 185 so formed as to enter the recess portion 129 and the groove portion 119 of each internal electrode layer 12 is firmly fixed to the outer peripheral surface of the ceramic stacked body 10.

Next, the production method of the stacked-type piezoelectric device 1 according to this example will be described.

Figure 4:
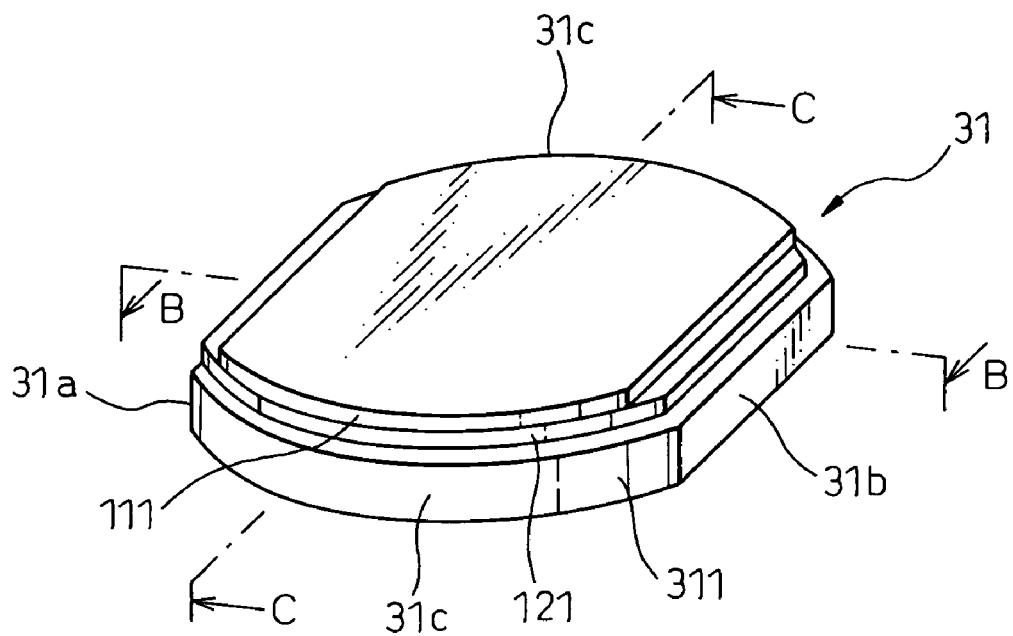
FIG. 4 is a perspective view showing a sheet piece according to Example 1.
Figure 7:
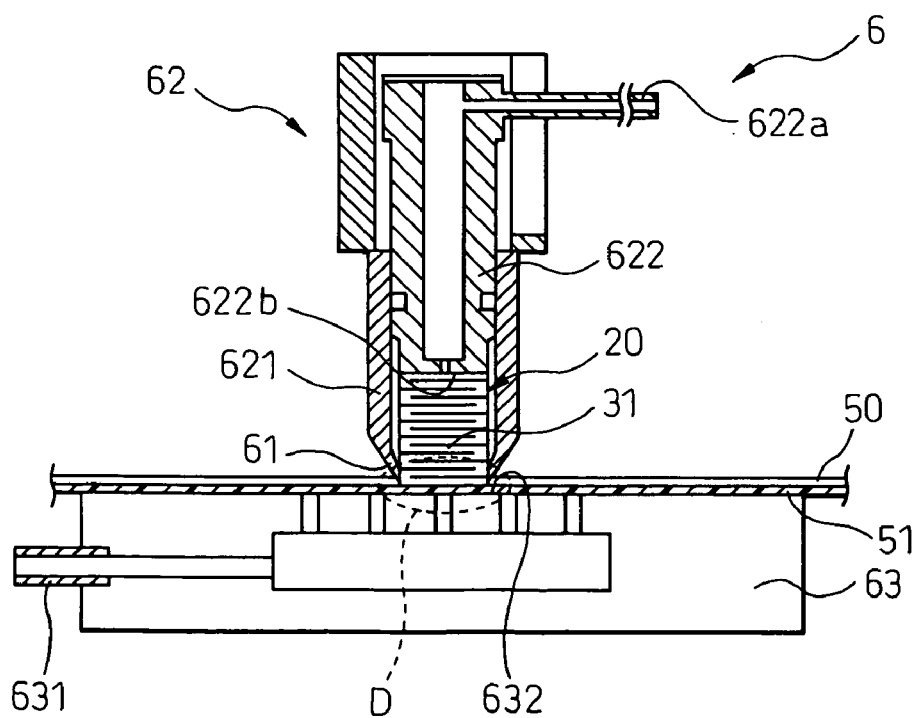
FIG. 7 is a sectional view showing a construction of a punch-out/tacking apparatus according to Example 1.

In the production method of the stacked piezoelectric device 1, the method of producing the ceramic stacked body 10, in particular, can be carried out by the following steps: a green sheet formation step of forming a green sheet 50 made of a ceramic raw material 311, for punching out sheet pieces 31, as shown in FIGS. 3 and 4; an electrode arrangement step of printing an electrode material 121 for forming the internal electrode portion 120 in an electrode material arrangement area 312 recessed inward from the outer edge of a punch-out area 310 for obtaining sheet pieces 31 in the green sheet 50; an adhesive material arrangement step of printing an adhesive material in an adhesive material arrangement area 314 recessed inward from the outer edge of an edge portion for forming a groove portion 119 in the punch-out area 310; a punch-out step of punching out the green sheet 50 and obtaining the sheet pieces 31, as shown in FIG. 7; a stacking step of stacking the sheet pieces 31 so punched out and forming an intermediate stacked body 30; and a firing step of firing the intermediate stacked body 30 to obtain a ceramic stacked body 10 (FIG. 1).

In the formation of the ceramic stacked body 10, the green sheet formation step described above is first carried out. In this step, a green sheet 50 (FIG. 3) is prepared by spreading a slurry of the piezoelectric material into a sheet form. Here, the slurry is prepared by adding a binder and trace amounts of plasticizer and de-foaming agent to a ceramic raw material capable of providing a piezoelectric ceramic such as lead zirco-titanate and dispersing the mixture in an organic solvent.

In the green sheet formation step, the slurry is applied onto a carrier film 51 (FIG. 3) by a doctor blade method to form a green sheet 50 having a thickness of 100 μm. Formation of the green sheet 50 from the slurry can be carried out by using various other methods such as extrusion molding besides the doctor blade method used in this example.

Next, as shown in FIGS. 3 and 4, in the electrode arrangement step, the electrode material 121 is applied in the electrode material arrangement area 312 recessed inward from the outer edge of the punch-out area 310 on the entire outer periphery of the punch-out area 310 of the green sheet 50. In this example, the stay amount G2 of the electrode material arrangement area 312 is G2=300 μm so as to form the stay portion 128 (FIG. 1) in one (310a in FIG. 1) of the two linear portions 310a and 310b as the bond surfaces 15 of the ceramic stacked body 10 among the outer edge of the barrel-shaped punch-out area 310. The stay amount G1 of the electrode material arrangement area 312 is G1=50 µm round the entire outer periphery of the punch-out area 310 other than this linear portion 310a.

Note in the illustrated electrode arrangement step that the slurry of the ceramic raw material 311 is printed to a stay portion formation area between the linear portion 310a and the outer edge of the electrode material arrangement area 312 to keep the surface of the punch-out area 310 as the stacking surface substantially uniform.

In the adhesive material arrangement step, the adhesive material 111 is applied in the adhesive material arrangement area 314 recessed inward from the outer edge extending along the linear portion 310b in the outer edge of the electrode material arrangement area 312. Here, the linear portion 310b of the punch-out area 310 is the portion at which the recess portion 129 is so formed as to face the bond surface 15. In the linear portion 310a of the punch-out area 310, on the other hand, the outer edge of the bonding material arrangement area 314 is arranged between the linear portion 310a and the outer edge of the electrode material arrangement area 310, and the outer edge of the adhesive material arrangement area 314 is arranged at the curve portion 310c of the punch-out area 310 in such a fashion as to be substantially coincident with the outer edge position of the electrode material arrangement area 312.

Alternatively, the adhesive material arrangement area extending to the outer edge of the punch-out area 310 may be formed at the linear portion 310a at which the stay portion 128 of the ceramic stacked body 10 is formed.

Figure 5:
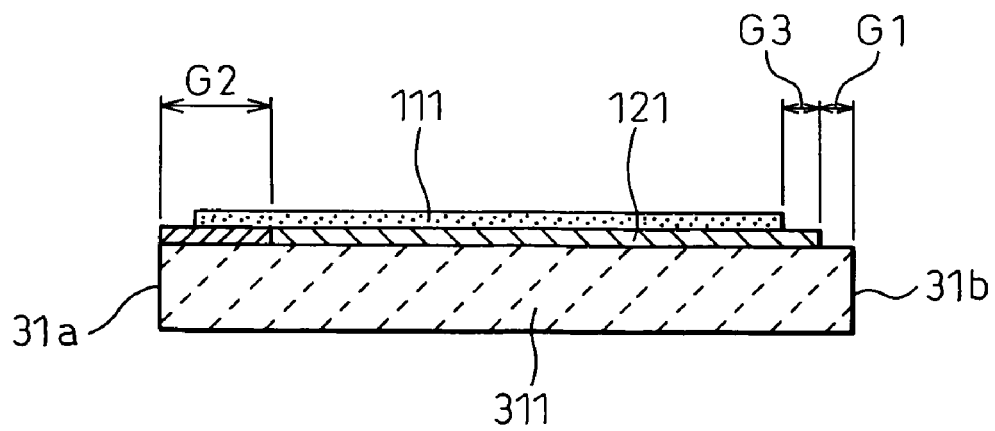
FIG. 5 is a sectional view, taken along a line B-B in FIG. 4, showing a sectional structure of the sheet piece according to Example 1.
Figure 6:
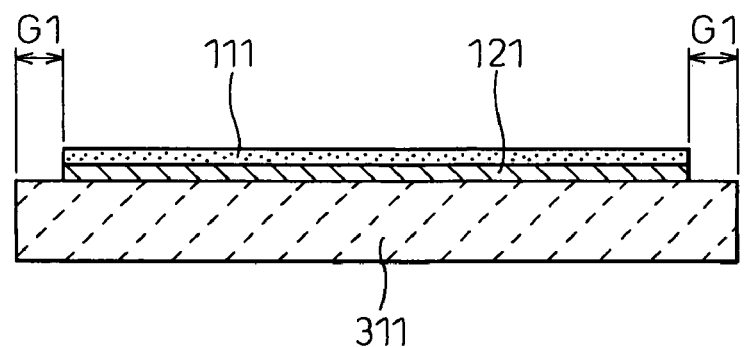
FIG. 6 is a sectional view, taken along a line C-C in FIG. 4, showing the sectional structure of the sheet piece according to Example 1.

After the electrode arrangement step and the adhesive material arrangement step, the punch-out area 310 can be punched out in the punch-out step to obtain the sheet pieces 31 each having a three-layered structure including a base layer of the ceramic raw material 311, an arrangement layer of the electrode material 121 and an arrangement layer of the adhesive material 111, as shown in FIGS. 4 to 6.

As shown in FIGS. 4 to 6, in each sheet piece 31, the stay distance G2 at the outer peripheral edge portion of the electrode material 121 at one (31a in FIGS. 4 to 6) of the two linear portions 41a and 31b forming the bond surfaces 15 of the barrel-shaped ceramic stacked body 10 is G2=300 µm and the stay distance G1 of the outer peripheral edge portion of the electrode material 121 in the entire outer periphery of the sheet piece 31 other than this linear portion 31a is G1=50 µm.

Further, in this sheet piece 31, the outer peripheral edge portion of the adhesive material 111 is recessed inward from the outer peripheral edge portion of the electrode material 121 at the linear portion 31b at which the recess portion 129 is formed (stay distance G3=50 µm). The outer peripheral edge portion of the adhesive material 111 is positioned between the linear portion 31a and the outer peripheral edge portion of the electrode material 121 at the linear portion 31a at which the stay portion 128 is formed. Furthermore, the outer peripheral edge portion of the adhesive material 11 is substantially in conformity with the outer peripheral edge portion of the electrode material 121 at the curve portion 31c of the outer peripheral edge of the sheet piece 31.

Note that, in this example, the punch-out areas 310 are continuously arranged on the green sheet 50 that is elongated in the longitudinal direction as shown in FIG. 3 so that the sheet pieces 31 can be continuously punched out. In this example, the punch-out areas 310 having the mirror image relation are arranged adjacent to one another so that the arrangement of the stay portion formation area 316 forming the stay portion 128 in the intermediate stacked body 30 (FIG. 10) becomes different in every layer.

Next, in this example, a punch-out/stacking apparatus 6 is so constituted as to be capable of simultaneously conducting the punch-out step and the stacking step, and carries out the punch-out step of the sheet pieces 31 in parallel with the stacking step, as shown in FIG. 7. Here, the sheet pieces 31 are continuously punched out from the green sheet 50 and are serially stacked to produce the intermediate stacked body 30 as illustrated.

The construction and operation of the punch-out/stacking apparatus 6 will be then explained. The punch-out/stacking apparatus 6 is the apparatus that is so constituted to be capable of punching out and stacking the sheet pieces 31 as shown in FIG. 7. The punch-out/stacking apparatus 6 has a Thomson blade 61 for punching out the sheet pieces 31 from the green sheet 50, a Thomson mold 62 for accommodating therein a sheet stacked body 20 formed by stacking the sheet pieces 31 and a table 63 for putting thereon a carrier film 51 for holding the green sheet 50.

The Thomson mold 62 has a substantially cylindrical cylinder portion 6121 having a Thomson blade 61 at its distal end on the side of the table 63 and a stacking weight 622 constituted in such a fashion as to move back and forth in accordance with a stacking height of the sheet stacked body 20 stacked inside the cylinder portion 621.

As shown in FIG. 7, the stacking weight 622 has a suction port 622a for connecting a tube extended from a vacuum pump (not shown). A suction port communicating with the suction port 622a opens on a stacking adsorption surface 622b facing the inside of the cylinder portion 621 on the outer surface of the stacking weight 622. The Thomson mold 62 is so constituted as to adsorb the sheet pieces 31 constituting the stacking end face of the sheet stacked body 20 to the stacking adsorption surface 622b and to hold the sheet stacked body 20 inside the cylinder portion 621.

The table 63 is constituted in such a fashion as to place and hold thereon the carrier film 51 holding the green sheet 50. Further, the punch-out/stacking apparatus 6 used in this example feeds the carrier film 51 put on the table 63 by a feed mechanism, not shown, and continuously punches out the sheet pieces 31. The table 63 has a suction port 631 connected to the vacuum pump, not shown. The table 63 has an adsorption port communicating with the suction port 631 on its placement surface 632 and can reliably adsorb and hold the carrier film 51 put thereon.

Figure 8:
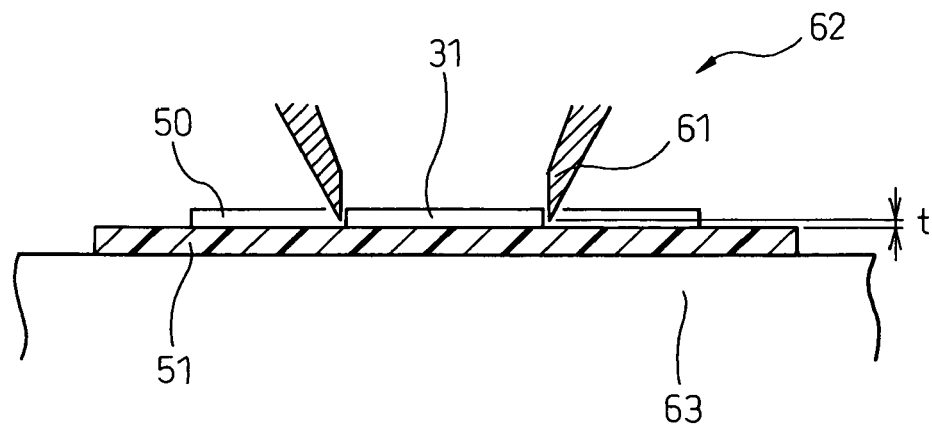
FIG. 8 is an explanatory view showing a stroking state of a Thomson mold according to Example 1.

Furthermore, as shown in FIG. 8, the punch-out/stacking apparatus 6 is constituted in such a fashion that, when the Thomson mold 62 moves and comes closest to the table 63, the tip of the Thomson blade 61 and the surface of the carrier film 51 have a slight clearance t corresponding to 5 to 10% of the thickness of the green sheet 50. Consequently, the punch-out/stacking apparatus 6 can reliably punch out only the sheet pieces 31, by the Thomson blade 61, from the green sheet 50 held by the carrier film 51.

Figure 9:
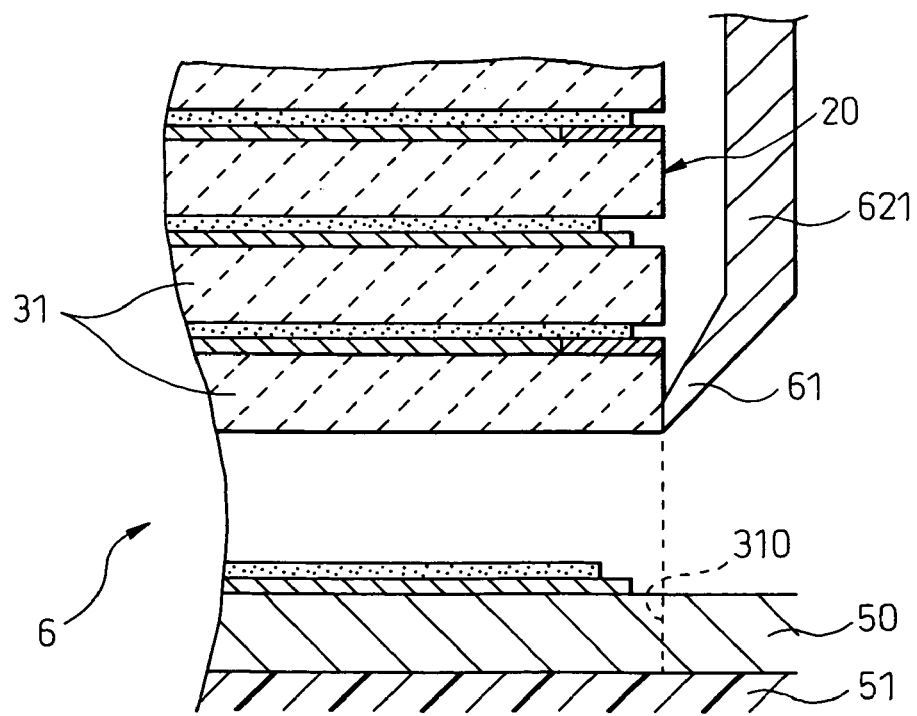
FIG. 9 is an enlarged sectional view of the section "D" of FIG. 7 showing in magnification a portion near a tip of a Thomson blade according to Example 1.

Here, the Thomson mold 62 has the cylinder portion 621 having an inner diameter greater than the resulting sheet stacked body 20, as shown in FIG. 9. The Thomson mold 62 has the Thomson blade 61 the diameter of which reduces as it comes closer to the table 63, and the tip of the Thomson blade 61 is substantially coincident with the outer edge shape of the punch-out area 310.

Therefore, in the punch-out/stacking apparatus 6, friction does not occur between the inner peripheral surface of the cylinder portion 621 and the outer peripheral surface of the sheet stacked body 20. Therefore, the possibility of adhesion of the electrode material 121 to the outer peripheral surface of the sheet stacked body 20 is small. In other words, the possibility of adhesion of fired matter of the electrode material 121 to the outer peripheral surface of the ceramic stacked body 10 obtained by firing the intermediate stacked body 30 formed by this punch-out/stacking apparatus 6 is small and thus the outer peripheral surface need not be polished. Consequently, the resulting ceramic stacked body 10 is free from the occurrence of micro-cracks and other defects on its outer peripheral surface resulting from machining such as polishing, and thus has excellent quality.

When the intermediate stacked body 30 is produced by using the punch-out/stacking apparatus 6 having the construction described above, the carrier film 51 holding the green sheet 50 is put on the placement surface 632 of the table 63 as shown in FIG. 7. The carrier film 51 is then moved in the longitudinal direction to bring the punch-out position by the Thomson blade 61 into conformity with the punch-out area 310 (FIG. 3) and to punch out the sheet pieces 31. Punching of the sheet pieces 31 is continuously carried out and the sheet stacked body 20 is serially formed inside the Thomson mold 62. In this example, the above procedures were repeated at a predetermined number of times, to produce the intermediate stacked body 30 having a predetermined number of stacked sheet pieces 31.

Figure 10:
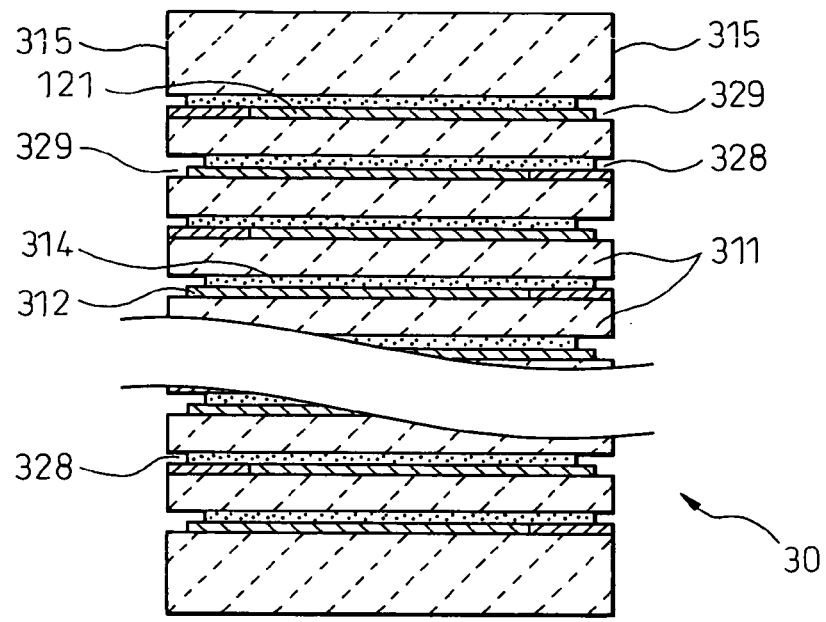
FIG. 10 is sectional view showing a sectional structure of an intermediate stacked body according to Example 1.

Stacking of the sheet pieces 31 in the manner describe above provides the intermediate stacked body 30 having the construction in which the electrode material 121 is arranged at the inner peripheral portion between the adjacent layers of the ceramic raw material 311 as shown in FIG. 10, and having the barrel-shaped sectional shape having a pair of flat surfaces 315 to serve as the bond surfaces 15. In the intermediate stacked body 30, the outer peripheral edge portion of the electrode material 121 faces the clearance 329 between the adjacent layers of the ceramic raw material 311 throughout the entire surface of the outer peripheral surface other than one of the flat surfaces 315. On one of the flat surfaces 315, the outer peripheral edge portion of the electrode material 121 is covered with the slurry printed in the stay portion formation area 316 (FIG. 3).

In particular, in the adhesive material arrangement step, the adhesive material 111 is arranged in such a fashion as to be recessed inward (stay distance G3=50 μm) from the outer edge of the electrode material arrangement area 312 at the linear portion 310b on the formation side of the recess portion 129 in the two linear portions 310a and 310b in the punch-out area 310, as shown in FIG. 3. Therefore, even when a load is applied in the stacking direction during stacking of the sheet pieces 31, the adhesive material 111 does not fluidize beyond the outer peripheral edge portion of the electrode material 121. Consequently, at the portion at which the recess portion 129 (FIG. 1) facing the bond surface 15 is to be formed, the outer peripheral edge portion of the electrode material 121 constituting the internal electrode portion 120 can be reliably exposed in such a fashion as to face the clearance 329 defined between the adjacent layers of the ceramic raw material 311 stacked.

Further, in the adhesive material arrangement step, the adhesive material 111 is printed to the adhesive material arrangement area 314 positioned on the inner peripheral side of the punch-out/stacking area 310 as shown in FIG. 3. Therefore, the groove-like clearance 328 can be formed adjacent to the ceramic raw material layer 311 throughout the entire periphery of the outer peripheral surface of the intermediate stacked body 30.

Next, the ceramic stacked body 10 is obtained by firing the intermediate stacked body 30 described above in the firing step. The firing step is carried out by accommodating the intermediate stacked body 30 into a firing furnace (not shown).

Heating is done gradually until the inner temperature of the furnace reaches 1,100° C. in the course of 110 hours and the furnace inner temperature is thereafter kept for 2 hours for firing. Thereafter, the firing furnace is gradually cooled.

The ceramic stacked body 10 having high dimensional accuracy can be obtained by firing the intermediate stacked body 30 while the shape of the clearances 328 and 329 formed in each flat surface 315 and the shape of the clearance formed in the outer peripheral curve surface are kept at a high level of accuracy by controlling the inner temperature of the firing furnace as described above.

Figure 11:
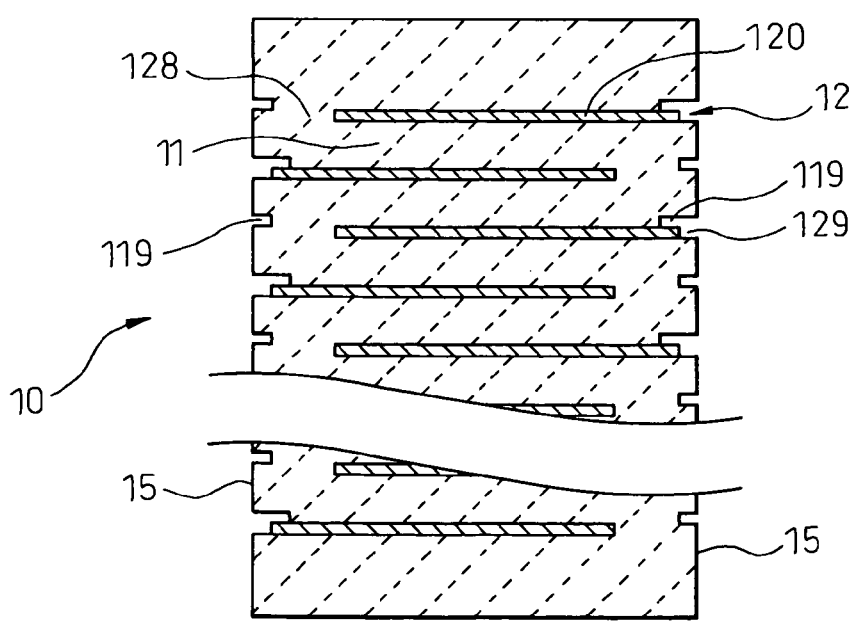
FIG. 11 is a sectional view showing a sectional structure of a ceramic stacked body according to Example 1.

In the resulting fired stacked body 10, the ceramic raw material layer 311 and the adhesive material 111 printed onto the surface of each sheet piece 31 are fired and integrally form the ceramic layer 11 as shown in FIG. 11. Because the adhesive material 111 is printed in such a fashion as to be recessed inward from the outer edge of the sheet piece 31 as described above, the groove portion 119 is formed along the stacking surface of the inner electrode layer 12.

Further, the electrode material 31 forms the inner electrode portion 120 upon firing. In this example, the electrode material 121 is printed in such a fashion as to be recessed inward from the outer edge of the sheet piece 31 with the exception of one of the linear portions (linear portion 31a in this example) of the outer edge of the sheet piece 31 (stay distance G1 shown in FIGS. 5 and 6). In the ceramic stacked body 10, therefore, the recess portion 129 is formed throughout the entire outer peripheral surface with the exception of one of the bond surfaces 15. In this example, further, the adhesive material 111 is printed (stay distance G3 shown in FIG. 5) in such a fashion as to be further recessed inward from the outer peripheral edge of the electrode material 121 in the other linear portion (linear portion 31b in this example). Therefore, the inner electrode portion 120 can be reliably exposed from the bottom surface of the recess portion 129 at this recess portion 129 facing the bond surface 15.

The slurry applied on the surface of the sheet piece 31 in parallel with the electrode material 121 to form the stay portion 128 described above can form the ceramic material having the same composition as that of the ceramic layer 11 upon baking. Therefore, the stay portion 128 made of the ceramic material is formed in a part of the inner electrode layer 12.

In the ceramic stacked body 10, the stay portion 128 and the recess portion 129 as the internal electrode layer 12 are alternately exposed on each bond surface 15.

In the stacked-type piezoelectric device 1 of this example, the external electrodes 18 are fitted to the pair of bond surfaces 15 of the ceramic stacked body 10, respectively, as shown in FIG. 2. While the conductive resin material 180 having conductivity is filled into the recess portion 129 and the groove portion 119 of the internal electrode layer of every other layer on the bond surface 15 of the ceramic stacked body 10, the external electrodes 18 are bonded. Further, in the stacked-type piezoelectric device 1, the entire outer peripheral surface of the ceramic stacked body 10 having the external electrodes 18 bonded thereto is covered with the molding resin 185 having the electric insulating property.

As described above, the ceramic stacked body of this example is obtained by the steps of punching out the sheet pieces 31 having the electrode material 121 so arranged as to be recessed inward from the outer edge throughout the entire outer periphery of the punch-out area 310, stacking the sheet pieces 31 and firing the resulting intermediate stacked body 30. Therefore, when the sheet pieces 31 forming the intermediate stacked body 30 are punched out from the green sheet 50, the possibility of adhesion of the electrode material 121 to the outer periphery of the sheet pieces 31 is extremely small. When the sheet stacked body 20 is formed inside the Thomson mold 62, friction of the inner peripheral surface of the cylinder portion 621 and the outer peripheral surface of the sheet stacked body 20 is not likely to occur in the sheet stacked body 30 in which the electrode material is not exposed to the outer peripheral surface, and the possibility of adhesion of the electrode material to the outer peripheral surface of the sheet stacked body 20 is small.

Therefore, in the ceramic stacked body 10 obtained by firing the intermediate stacked body 30 produced as described above, the possibility of adhesion of the fired matter, of the electrode material 121, to the outer peripheral surface of the ceramic stacked body 10 is extremely small, and the electric insulating property can be ensured with a high reliability even though machining such as polishing, cutting, etc, of the outer peripheral surface is not executed. Consequently, the ceramic stacked body 10 of this example is free from the occurrence of the micro-cracks on its outer surface resulting from machining of its outer peripheral surface, and has excellent quality.

Furthermore, in this example, the sheet pieces 31 are obtained by printing the electrode material to the electrode material arrangement area 31 recessed inward from the outer edge of the punch-out area 310 and then punching out the punch-out area 310. For this reason, the electrode material 121 does not remain on the surface of the green sheet 50 after the punch-out step is carried out, and the green sheet after the sheet pieces 31 are punched out can be easily re-utilized.

Moreover, in the ceramic stacked body 10 according to this example, the recess portion 129 is formed in a part of the outer periphery of each internal electrode portion 120 and the groove portion 119 is formed in such a fashion as to extend on the entire outer periphery along the stacking surface of each internal electrode layer 12. Therefore, the conductive resin material 180 disposed in the bond surface 15 or the molding resin 185 covering the entire outer peripheral surface enters the recess portion 129 and the groove portion 119. Consequently, the conductive resin material 180 and the molding resin 185 are firmly held on the outer peripheral surface of the ceramic stacked body 10 and electric reliability is high.

The depth of the recess portion 129 in this example is 80 μm from the outer peripheral surface of the ceramic stacked body 10. Therefore, the recess portion 129 hardly affects dimensional accuracy and the strength of the ceramic stacked body 10. In this example, the electrode material arrangement area 312 is formed on the inner peripheral side of the punch-out area 310 in the preparation stage of the sheet pieces 31 constituting the intermediate stacked body 30 in such a fashion that the recess portion 129 can be formed by baking. Therefore, the strength and quality of the ceramic stacked body 10 are not deteriorated unlike the case where the recess portion 129 is formed by machining, etc, after the intermediate stacked body 30 is fired and becomes the ceramic stacked body 10.

Example 2

This example is intended to explain one modification where the construction of the internal electrode layer 12 was changed, but is based on the ceramic stacked body 10 of Example 1, and will be explained with reference to FIGS. 12 to 15.

Figure 12:
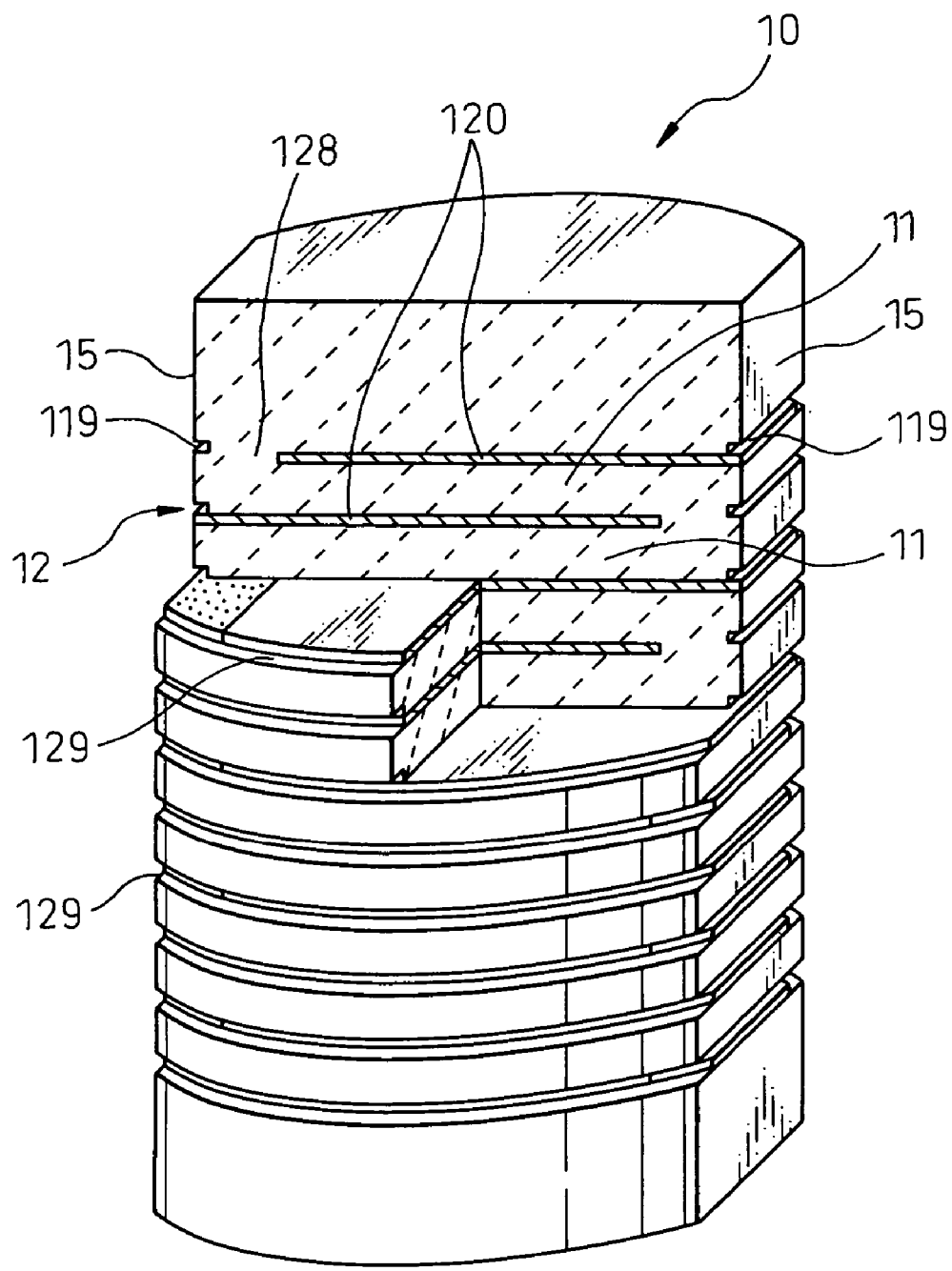
FIG. 12 is a partial sectional view showing a structure of a ceramic stacked body according to Example 2.

In each internal electrode layer 12 of the ceramic stacked body 10, the outer peripheral edge of the internal electrode portion 120 is directly exposed without forming the recess portion 129 facing the bond surface on the side where the stay potion 128 is not formed, as shown in FIG. 12.

Figure 13:
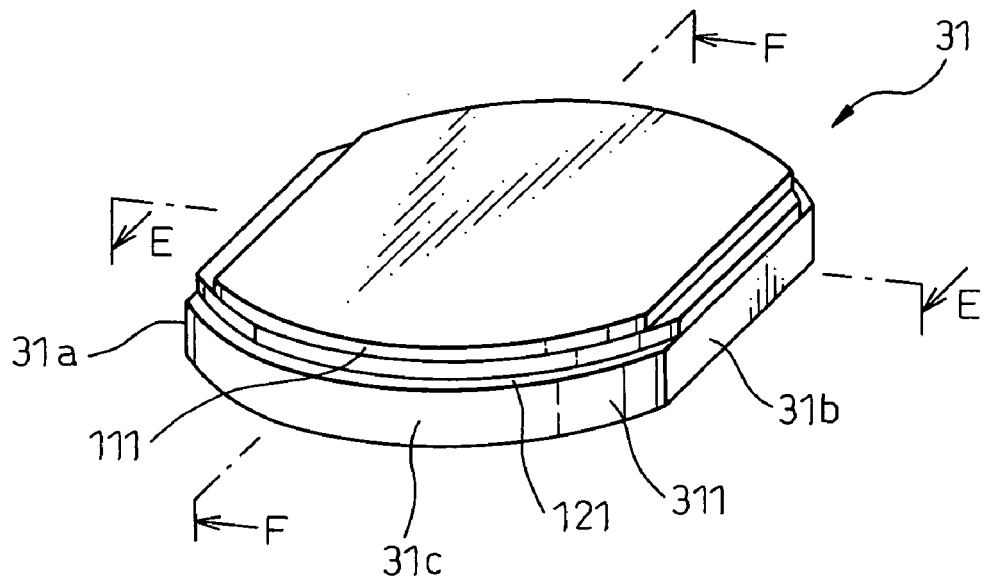
FIG. 13 is a perspective view showing a sheet piece according to Example 2.
Figure 14:
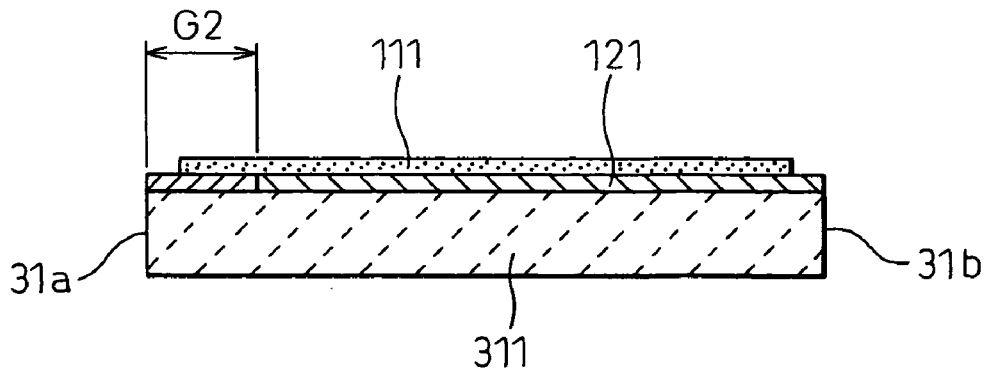
FIG. 14 is a sectional view, taken along a line E-E in FIG. 13, showing a sectional structure of the sheet piece according to Example 2.
Figure 15:
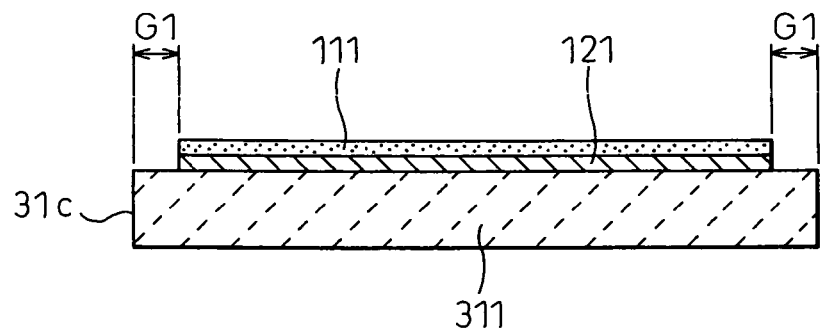
FIG. 15 is a sectional view, taken along a line F-F in FIG. 13, showing a sectional structure of the sheet piece according to Example 2.

Note that the ceramic stacked body 10 is obtained by firing the intermediate stacked body (not shown) prepared by stacking the sheet pieces 31 shown in FIGS. 13 to 15.

Further, in the sheet piece 31, the stay distance G2 of the outer peripheral edge portion of the electrode material 121 is G2=300 μm at one (31a in the drawings) of the two linear portions 31a and 31b serving as the bond surface 15 in the ceramic stacked body 10 having the barrel shape and the stay distance G1 of the outer peripheral edge portion of the electrode material 121 is G1=50 μm at the curve portion 31c of the sheet piece 31 other than the linear portions 31a and 31b. At the linear portion 31b, on the other hand, the position of the outer peripheral edge portion of the electrode material 121 is substantially in conformity with the outer edge position of the sheet piece 31.

Furthermore, in the sheet piece 31, the outer peripheral edge portion of the adhesive material 111 is positioned in such a fashion as to be recessed inward from the outer peripheral edge portion of the electrode material 121 at the linear portion 31b of the outer edge forming the barren shape on the side where the stay portion 128 is not formed. At the linear portion 31a forming the stay portion 128 in the sheet piece 31, the outer peripheral edge of the adhesive material 111 is positioned between the linear portion 31a and the outer peripheral edge portion of the electrode material 121. Furthermore, at the curve portion 31c of the outer edge of the sheet piece 31, the outer peripheral edge of the adhesive material 111 is positioned in such a fashion as to be substantially coincident with the outer peripheral edge portion of the electrode material 121.

The internal electrode portion 120 is formed on the outer peripheral surface of the ceramic stacked body 10 with the exception of the bond surface 15 in such a fashion as to be recessed inward. Therefore, in this production process, the possibility of adhesion of fired matter, of the electrode material 121, to the outer peripheral surface is small within this range. On each bond surface 15 of the ceramic stacked body 10, on the other hand, fired matter of the electrode material 121 that adheres when the sheet pieces 31 are punched out and stacked is likely to exist. In the ceramic stacked body 10 of this example, however, the internal electrode layers 12 disposed every other layer for exposing the internal electrode portion 120 to each bond surface 15 are electrically connected to the common external electrode. Therefore, the problem of the electric short-circuit is unlikely to occur even when fired matter of the electrode material 121 adheres to the bond surface 15.

Accordingly, the need for polishing the outer peripheral surface of the ceramic stacked body 10 is diminished in this example as in Example 1.

Note that the rest of constructions, functions and effects are the same as those of Example 1.

Example 3

Figure 16:
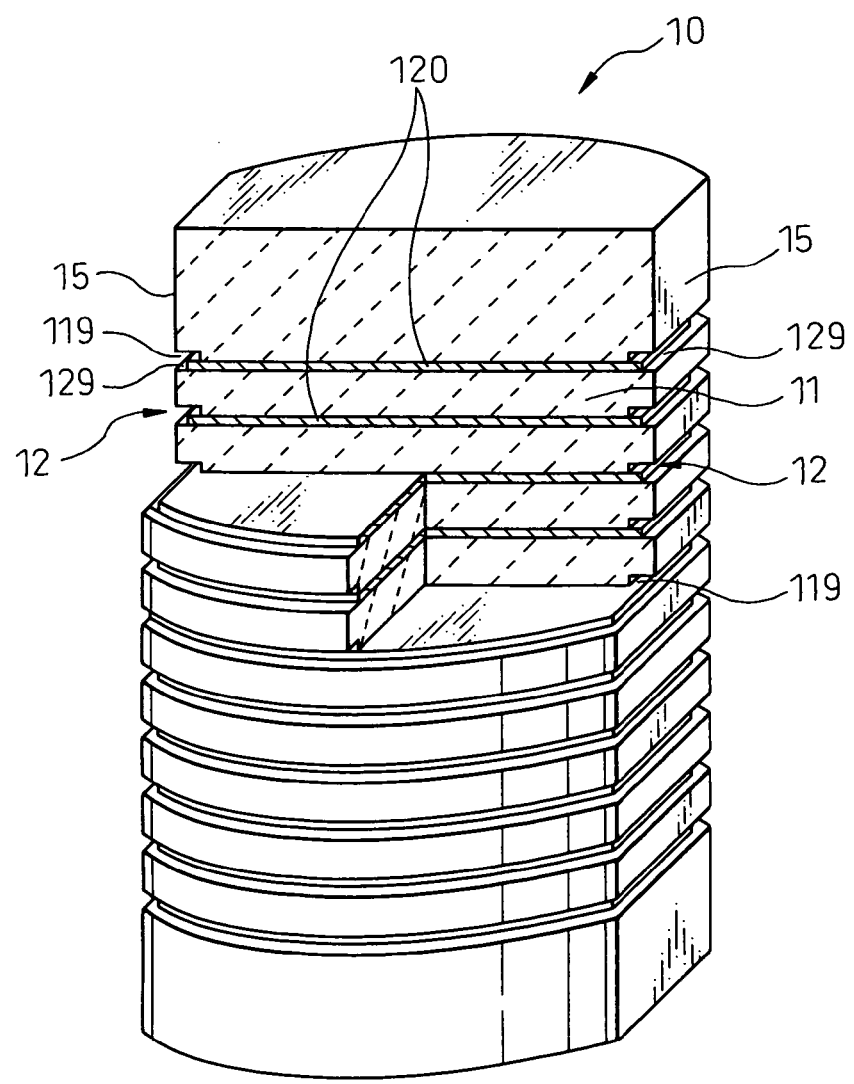
FIG. 16 is a sectional view showing a structure of a ceramic stacked body according to Example 3.

This example is intended to explain one modification where the construction of each internal electrode layer was changed, but is based on the stacked-type piezoelectric device of Example 1, and will be explained with reference to FIGS. 16 to 18.

Each internal electrode layer 12 of the ceramic stacked body 10 has the recess portion 129 facing each bond surface 15. Each internal electrode layer 12 has the internal electrode portion 120 and the recess 129 so formed as to extend throughout the entire outer periphery. In other words, the ceramic stacked body 10 of this example has a so-called "full surface electrode structure" the internal electrode layer 12 of which does not have the stay portion.

Figure 17:
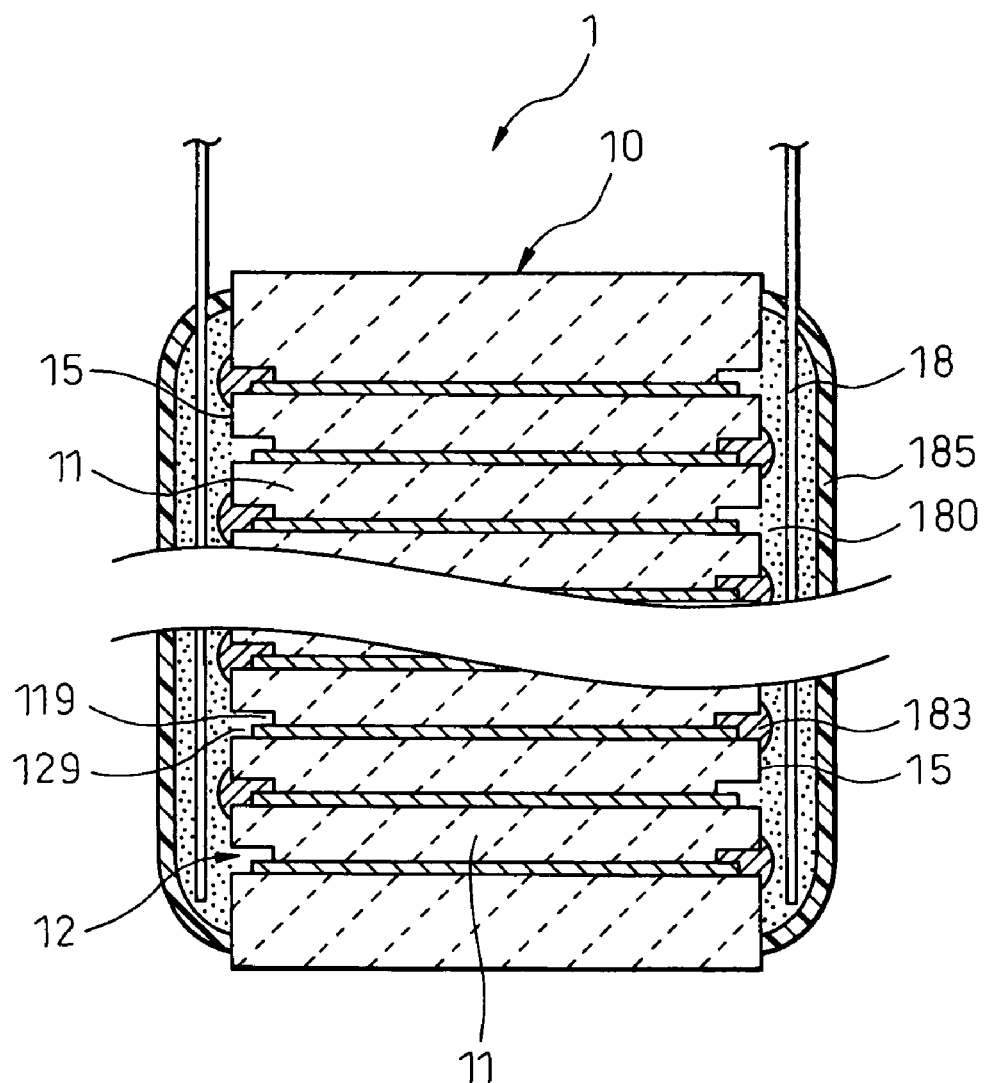
FIG. 17 is a sectional view showing a sectional structure of a stacked-type piezoelectric device according to Example 3.

An insulating portion 183 made of an electrically insulating material is formed in each recess portion 129 of each of every other internal electrode layers 12 on each bond surface 15 of the stacked-type piezoelectric device 1, as shown in FIG. 17. The external electrode 18 is bonded to each bond surface 15 on which the insulating portion 183 is disposed, by using the electrically conductive resin material 180.

Note that the rest of constructions, functions and effects are the same as those of Example 1.

Figure 18:
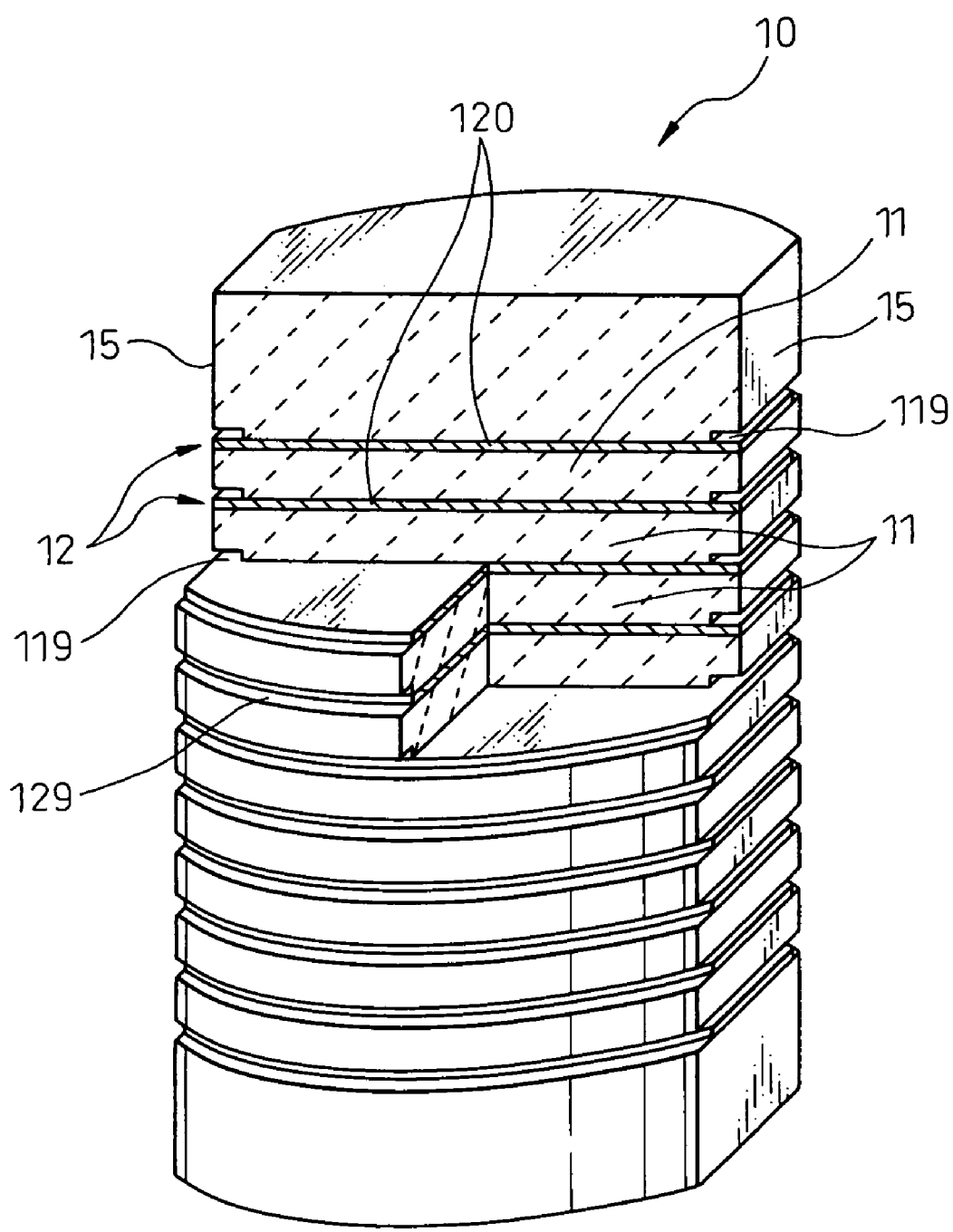
FIG. 18 is a partial sectional view showing a structure of another ceramic stacked body according to Example 3.

It is also noted that the outer peripheral edge portion of the internal electrode portion 120 of each internal electrode layer 12 can be directly exposed to each bond surface 15 of the ceramic stacked body 10, as shown in FIG. 18.

The internal electrode portion 120 is so formed as to be recessed inward on the outer peripheral surface of the ceramic stacked body 10 with the exception of the bond surface 15. Therefore, the possibility of adhesion of fired matter of the electrode material to the outer peripheral surface within this range during the production process is small.

On the other hand, the fired product of the electrode material that adheres when the sheet pieces 31 are punched out and stacked is likely to exist on each bond surface 15 of the ceramic stacked body 10. In the ceramic stacked body 10, however, the groove portion 119 is so formed as to extend along each internal electrode layer 12 facing the bond surface 15. The groove portion 119 can secure electric insulation in the stacking direction extending along the surface of the bond surface 15. In consequence, the possibility of electric short-circuit of the internal electrode portions 120 of the internal electrode layers 12 stacked adjacent to one another is small.

Therefore, the need for polishing the outer peripheral surface after firing is also diminished to a small level in the ceramic stacked body 10 shown in FIG. 18.

Example 4

Figure 19:
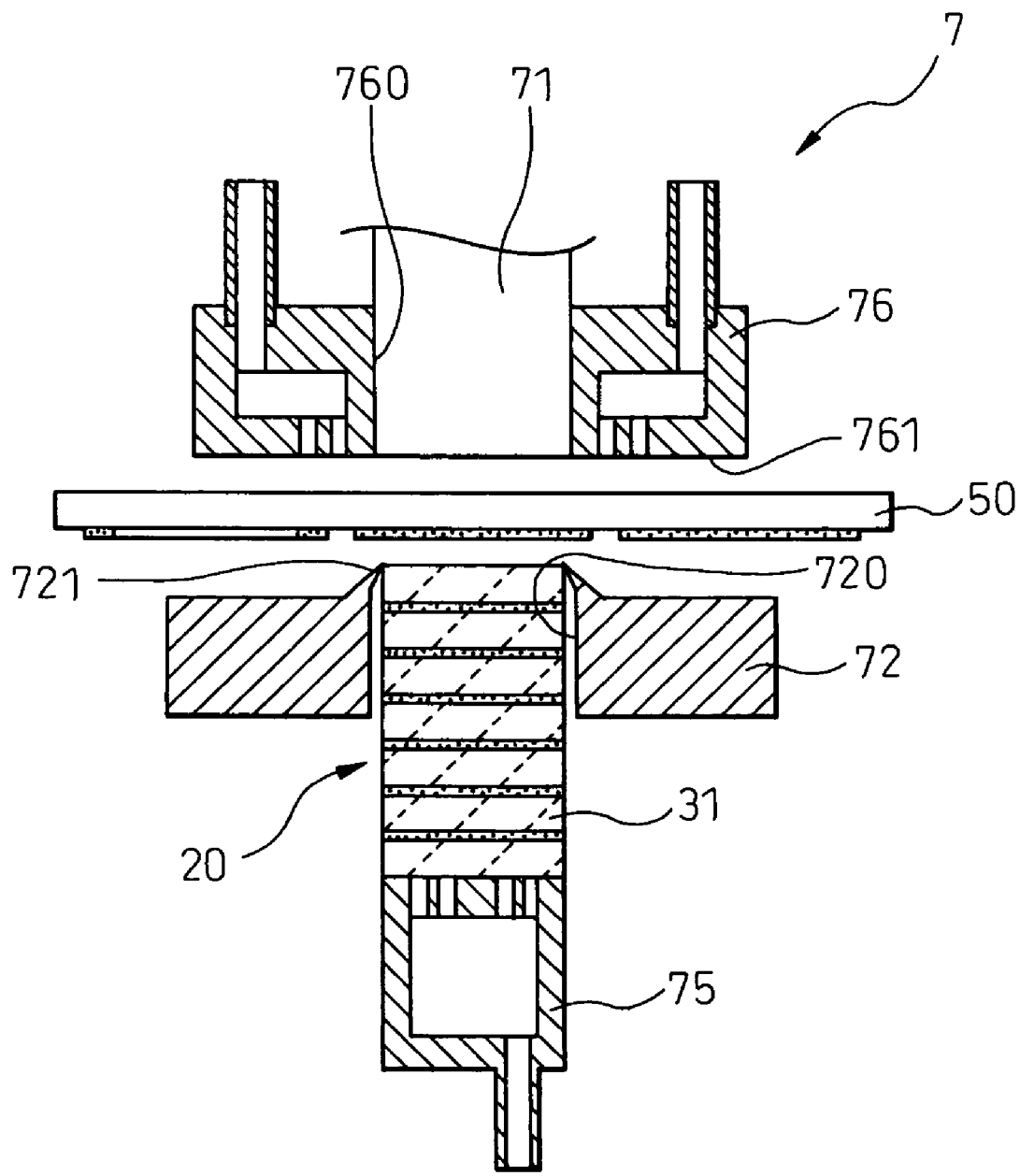
FIG. 19 is a sectional view showing a construction of a punch-out/stacking apparatus according to Example 4.

This example is intended to explain one modification where the construction of the punch-out stacking apparatus was changed, but is based on Example 1, and will be explained with reference to FIG. 19.

The punch-out/stacking apparatus 7 comprises a stacking holder, not shown, having a hollow structure, a punch 71 stroking towards the stacking holder, a die 72 having a hole 720 into which the punch 71 is inserted, and a holding block 76 having an adsorption surface 761 for adsorbing the green sheet 50 in such a fashion as to face the die 72. In particular, the punch 71 is constituted in such a fashion as to penetrate through a through-hole 760 bored in the holding block 76.

The punch-out/stacking apparatus 6 is so constituted as to punch out the sheet pieces 31 from the green sheet 50 by the combination of the punch 71 and the die 72 and to form the sheet stacked body 20 inside the aperture 720 of the die 72. A guide 75 having an adsorption surface at its upper end face is arranged inside the stacking holder in such a fashion as to be capable of sliding in the stroking direction of the punch 71. The guide 75 can hold the sheet stacked body 20 formed inside the stacking holder while pressing the sheet stacked body 20 in the stacking direction.

In particular, the die 72 has the aperture 720 greater than the outer diameter of the resulting sheet stacked body 20. A punch-out blade 721 an inner diameter of which progressively decreases towards the punch 71 and an opening shape 721 of which is substantially coincident with the shape of the punch-out area is formed at the open end of the aperture 720 on the side of the punch 71.

Therefore, friction is not likely to occur between the outer peripheral surface of the sheet stacked body 20 and the inner peripheral surface of the stacking holder when the sheet pieces 31 are punched out from the green sheet 50 and are stacked. In the intermediate stacked body 30 produced by using the punch-out/stacking apparatus 7, therefore, adhesion of fired matter of the electrode material to the outer peripheral surface of the intermediate stacked body 30 is small.

When the punch-out/stacking apparatus 7 is used, the ceramic stacked body requires less polishing of its outer peripheral surface and the occurrence of micro-cracks, etc, resulting from polishing of the outer peripheral surface of the ceramic stacked body can be prevented in advance.

The rest of constructions, functions and effects are the same as those of Example 1.

The invention claimed is:

1. A stacked-type piezoelectric device comprising a ceramic stacked body constituted by alternately stacking ceramic layers and internal electrode layers, and a pair of external electrodes respectively connected to a pair of bond surfaces formed on an outer peripheral surface of said ceramic stacked body, wherein said ceramic stacked body has a groove portion recessed into a groove shape in an outer peripheral surface of said ceramic stacked body, said groove portion being formed at least partially in a peripheral direction of said outer peripheral surface and being adjacent to a stacking surface of each of said internal electrode layers,
   wherein said internal electrode layer comprises an internal electrode portion having electric conductivity, and a recess portion formed by recessing inward an outer peripheral edge portion of said internal electrode portion from the outer peripheral surface of said ceramic stacked body and adjacent to said groove portion in the stacking direction, and
   wherein said internal electrode layer has a stay portion consisting of a ceramic material having substantially the same composition as that of said ceramic layer, said stay portion being formed by recessing an outer peripheral edge thereof from an outer peripheral surface of said ceramic stacked body on either one of said pair of bond surfaces, and said internal electrode layers of every other layers have said recess portion exposed on one bond surface of said pair of bond surfaces and have said stay portion on another bond surface, and said internal electrode layers of every other layers have said recess portion exposed on another bond surface of said pair of bond surfaces and have said stay portion on said one bond surface.

2. A stacked-type piezoelectric device as defined in claim 1, wherein the depth of said recess portion from the outer peripheral surface of said ceramic stacked body is 10 to 180 µm.

3. A stacked-type piezoelectric device as defined in claim 1, wherein said groove portion and said recess portion are extended throughout the entire outer periphery of said internal electrode layer.

4. A stacked-type piezoelectric device as defined in claim 1, wherein said recess portion of each of said internal electrode layers is extended throughout the entire outer peripheral surface of said ceramic stacked body other than said bond surface having said stay portion formed thereon.

5. A stacked-type piezoelectric device as defined in claim 1, wherein the depth of said groove portion is greater than the depth of said recess portion on at least said bond surface of the outer peripheral surface of said ceramic stacked body.

* * * * *